(12) United States Patent
Gandhi et al.

(10) Patent No.: US 11,282,775 B1
(45) Date of Patent: Mar. 22, 2022

(54) CHIP PACKAGE ASSEMBLY WITH STRESS DECOUPLED INTERCONNECT LAYER

(71) Applicant: XILINX, INC., San Jose, CA (US)

(72) Inventors: Jaspreet Singh Gandhi, San Jose, CA (US); Suresh Ramalingam, Fremont, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/942,930

(22) Filed: Jul. 30, 2020

(51) Int. Cl.
| | |
|---|---|
| *H01L 23/12* | (2006.01) |
| *H01L 23/34* | (2006.01) |
| *H01L 23/48* | (2006.01) |
| *H01L 23/28* | (2006.01) |
| *H01L 21/00* | (2006.01) |
| *H01L 21/44* | (2006.01) |
| *H01L 21/4763* | (2006.01) |
| *H01L 23/498* | (2006.01) |

(Continued)

(52) U.S. Cl.
CPC ...... *H01L 23/49822* (2013.01); *H01L 21/486* (2013.01); *H01L 21/561* (2013.01); *H01L 21/6835* (2013.01); *H01L 21/76885* (2013.01); *H01L 24/06* (2013.01); *H01L 24/08* (2013.01); *H01L 24/09* (2013.01); *H01L 24/19* (2013.01); *H01L 24/25* (2013.01); *H01L 25/0655* (2013.01); *H01L 21/4853* (2013.01); *H01L 23/3185* (2013.01); *H01L 23/49816* (2013.01); *H01L 23/49894* (2013.01); *H01L 2224/08235* (2013.01)

(58) Field of Classification Search
CPC ......... H01L 25/0655; H01L 2225/1058; H01L 24/09; H01L 24/19; H01L 24/25; H01L 24/06; H01L 23/49822; H01L 21/486; H01L 21/561; H01L 21/6835; H01L 21/76885

See application file for complete search history.

(56) References Cited

U.S. PATENT DOCUMENTS

| | | | |
|---|---|---|---|
| 10,332,856 B2 * | 6/2019 | Chen | H01L 24/82 |
| 2012/0286404 A1 * | 11/2012 | Pagaila | H01L 23/3107 |
| | | | 257/659 |

(Continued)

OTHER PUBLICATIONS

U.S. Appl. No. 16/672,802, filed Nov. 4, 2019, Entitled: "Fanout Integration for Stacked Silicon Package Assembly".

*Primary Examiner* — Alonzo Chambliss
(74) *Attorney, Agent, or Firm* — Patterson + Sheridan, LLP

(57) ABSTRACT

A chip package assembly having pillars extending between an interconnect layer and solder balls, and methods for manufacturing the same are provide. The pillars decouple stress from the interconnect layer, making crack initiation and propagation to the interconnect layer less likely, resulting in a more robust assembly. In one example, a chip package assembly is provided that includes an integrated circuit (IC) die, an interconnect layer and a plurality of pillars. The IC dies includes a die body containing functional circuitry. The body has a lower surface, an upper surface and sides. The IC die includes contact pads coupled to the functional circuitry and exposed on the lower surface of the die body. The interconnect layer is formed on the lower surface of the body. The plurality of pillars are formed on the interconnect layer and electrically couple to the contact pads through routing formed through the interconnect layer.

19 Claims, 24 Drawing Sheets

(51) Int. Cl.
  *H01L 23/00*    (2006.01)
  *H01L 21/48*    (2006.01)
  *H01L 21/56*    (2006.01)
  *H01L 25/065*   (2006.01)
  *H01L 21/768*   (2006.01)
  *H01L 21/683*   (2006.01)
  *H01L 23/31*    (2006.01)

(56) References Cited

U.S. PATENT DOCUMENTS

| | | | |
|---|---|---|---|
| 2016/0118311 A1* | 4/2016 | Hu | H01L 21/486 |
| | | | 257/737 |
| 2019/0304913 A1* | 10/2019 | Wu | H01L 24/19 |
| 2020/0105642 A1 | 4/2020 | Gandhi et al. | |
| 2020/0294927 A1* | 9/2020 | Wang | H01L 21/565 |
| 2021/0028145 A1* | 1/2021 | Yu | H01L 25/0652 |

* cited by examiner

CHIP PACKAGE ASSEMBLY WITH STRESS DECOUPLED INTERCONNECT LAYER

TECHNICAL FIELD

Embodiments of the present invention generally relate to a chip package assembly and methods for fabricating the same, and in particular, to a chip package assembly comprising a plurality of pillars disposed in mold compound that provide a portion of the electrical routing between at least one integrated circuit (IC) die and a package substrate, the pillars configured to reduce the potential of damage to the electrical routing during fabrication and use of the chip package assembly.

BACKGROUND

Electronic devices, such as tablets, computers, copiers, digital cameras, smart phones, control systems and automated teller machines, among others, often employ electronic components which leverage chip package assemblies for increased functionality and higher component density. Conventional chip packaging schemes often utilize a package substrate, often in conjunction with a through-silicon-via (TSV) interposer substrate, to enable a plurality of integrated circuit (IC) dies to be mounted to a single package substrate. The IC dies may include memory, logic or other IC devices.

In many next generation chip package assemblies, silicon-less interconnect technology has sought to eliminate the use of interposers with through silicon vias (TSVs) to connect IC dies to a package substrate. One proposed solution employs a FAB dielectric layer to provide routing between the IC dies and the solder connection with the package substrate. Although elimination of TSVs has performance and cost advantages through the use of FAB dielectric/solder connections over traditional TSV-based interposer designs, the FAB dielectric layer is susceptible to cracking particularly during reflow as the 100 μm silicon interposer is no longer present to decouple stress and provide structural support. Cracks in the FAB dielectric layer which may cause conductors (i.e., electrical traces or routings) within the FAB dielectric layer to break or become damaged. Broken and/or damaged conductors within the FAB dielectric layer can result in diminished performance, poor service life and even device failure.

Therefore, a need exists for a chip package assembly having improved resistance to damage and/or breakage of conductors within an interconnection layer disposed between an IC die and the substrate to which the IC die is mounted.

SUMMARY

A chip package assembly and methods for fabricating the same are provided that inhibit damage and/or breakage of conductor within an interconnect layer (i.e., a FAB dielectric layer) disposed between at least one integrated circuit (IC) die and an underlying package substrate. Robust protection of the interconnect layer is provided in one example by utilizing a chip package assembly having pillars extending between an interconnect layer and solder balls. The pillars decouple stress present in the package assembly from the interconnect layer, making crack initiation and propagation into the interconnect layer less likely, resulting in a more robust electrical and mechanical connection between the IC die and substrate through the interconnect layer.

In one example, a chip package assembly is provided that includes an integrated circuit (IC) die, an interconnect layer and a plurality of pillars. The IC dies includes a die body containing functional circuitry. The body has a lower surface, an upper surface and sides. The IC die includes contact pads coupled to the functional circuitry and exposed on the lower surface of the die body. The interconnect layer is formed on the lower surface of the body. The plurality of pillars are formed on the interconnect layer and electrically couple to the contact pads through routing formed through the interconnect layer.

In another example, a method for forming a chip package assembly is provided that includes attaching a first surface of a first integrated circuit (IC) die to an interconnect layer formed on a wafer; disposing a die-level mold compound around the first IC die; making the die-level mold compound coplanar with a second surface of the first IC die; attaching the die-level mold compound and the second surface of the first IC die to a carrier; patterning the wafer to form temporary posts on the interconnect layer; disposing a pillar-level mold compound around the temporary posts; making the temporary posts and the pillar-level mold compound coplanar; exposing contacts of the interconnect layer in passages formed in the pillar-level mold compound formed by removing the temporary posts; forming conductive pillars in the passages of the pillar-level mold compound, the conductive pillars electrically coupled to circuitry of the first IC die through the interconnect layer; depositing solder balls on the conductive pillars; and detaching the carrier.

In yet another example, a method for forming a chip package assembly is provided that includes attaching a first surface of a first integrated circuit (IC) die to an interconnect layer formed on a wafer; disposing a die-level mold compound around a first integrated circuit (IC) die; making the die-level mold compound coplanar with a second surface of the first IC die; attaching the die-level mold compound and the second surface of the first IC die to a carrier; removing the wafer; depositing a seed layer on the interconnect layer; depositing a photoresist layer on the seed layer; patterning the photoresist layer to expose portions of the seed layer; forming conductive posts on the exposed portions of the seed layer; removing the photoresist layer; removing portions of the seed layer not covered by the pillars, the remaining portion of the seed layer and conductive posts forming conductive pillars that are electrically coupled to circuitry of the first IC die through the interconnect layer; disposing a pillar-level mold compound around the pillars; making the pillars and the pillar-level mold compound coplanar; depositing solder balls on the conductive pillars; and detaching the carrier.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements of one embodiment may be beneficially incorporated in other embodiments.

DETAILED DESCRIPTION

A chip package assembly and methods for fabricating the same are provided inhibit damage and/or breakage of conductors within an interconnect layer (also referred as a "FAB dielectric layer") disposed between at least one integrated circuit (IC) die and an underlying package substrate. In one example, a conductive pillar is disposed between the interconnect layer and a solder ball utilized to electrically and mechanically couple the IC die to underlying substrate. The conductive pillar is disposed through a pillar-level mold compound. The conductive pillar and the pillar-level mold compound are more compliant than the interconnect layer, and thus accommodate slight motion between the IC die and underlying substrate, such as caused by differences in thermal expansion. The compliant conductive pillar and pillar-level mold compound structure decouples stress present within the chip package assembly from propogating through the solder connection to the interconnect layer. By decoupling stress from the interconnect layer, crack generation and crack propagation into the interconnect layer where conductive routings may be damaged or broken is greatly reduced as compared to conventional pillar-less designs. Advantageously, a more robust and reliable solder interconnect is enabled by the pillars to provide improved manufacturing yield, reliability, life and performance of the chip package assembly.

Figure 1A:
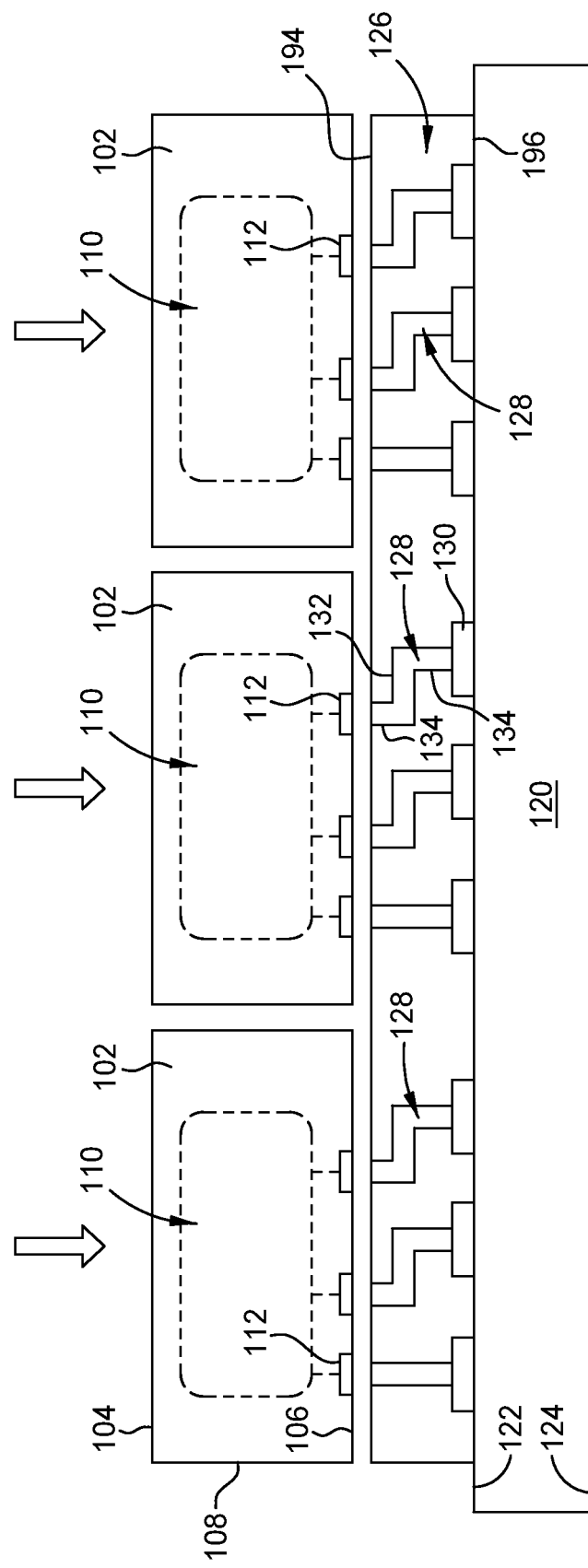
FIGS. 1A-1J are schematic sectional views across different stages of a chip package assembly fabrication sequence, one example of which described with reference to a method described with reference to FIG. 2.
Figure 1B:
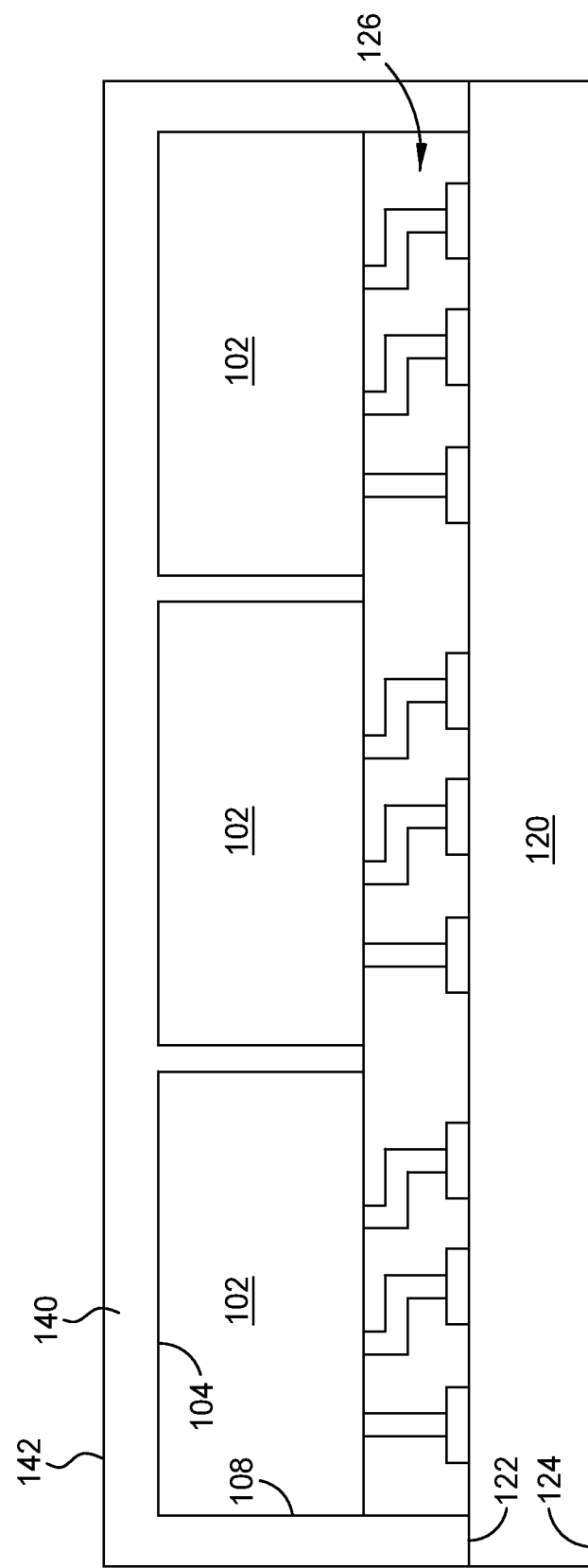
Figure 1C:
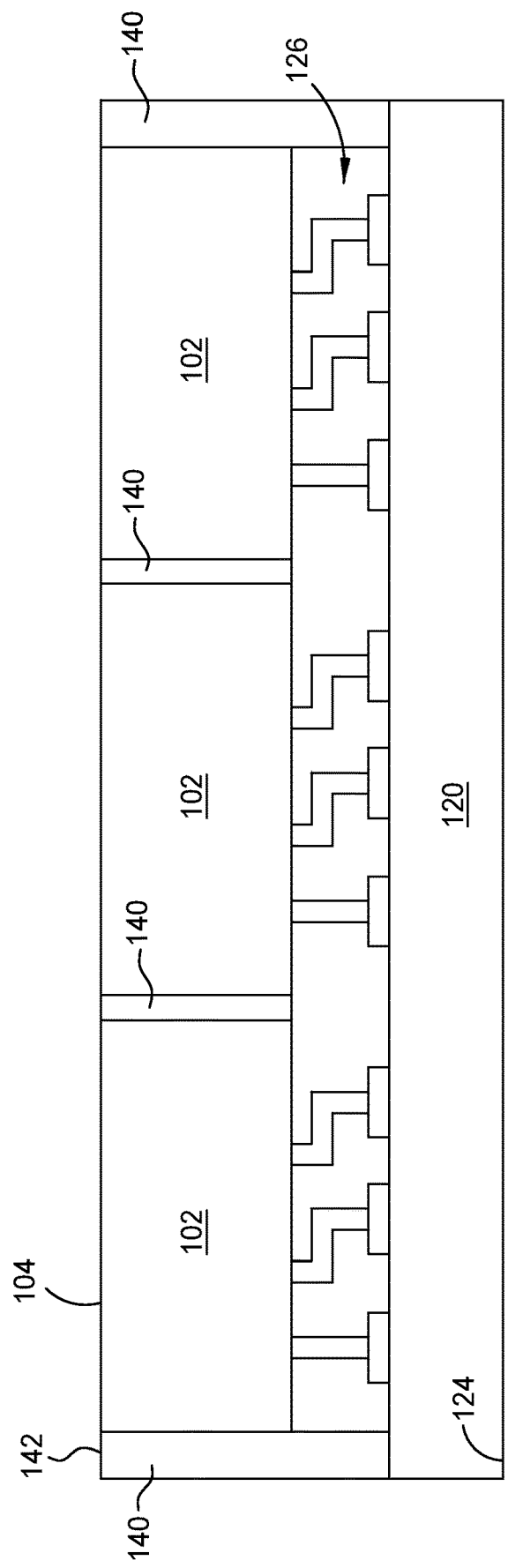
Figure 1D:
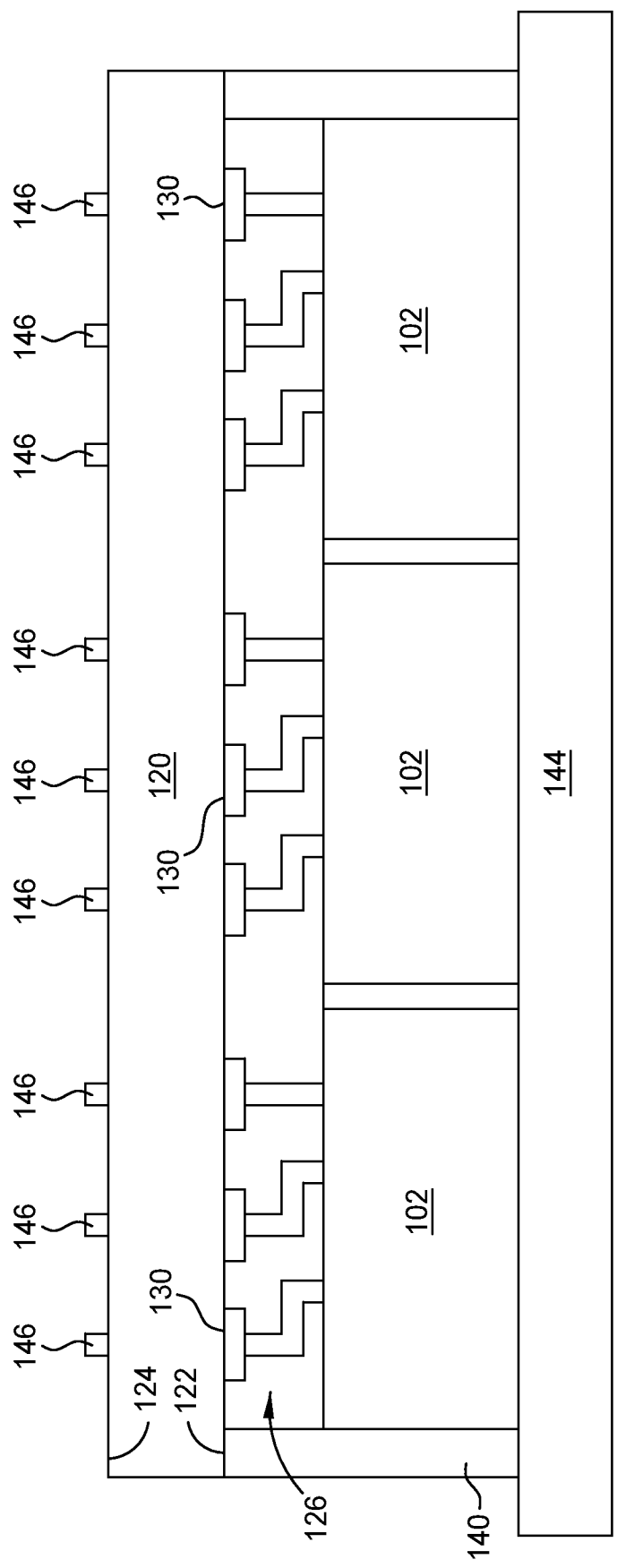
Figure 1E:
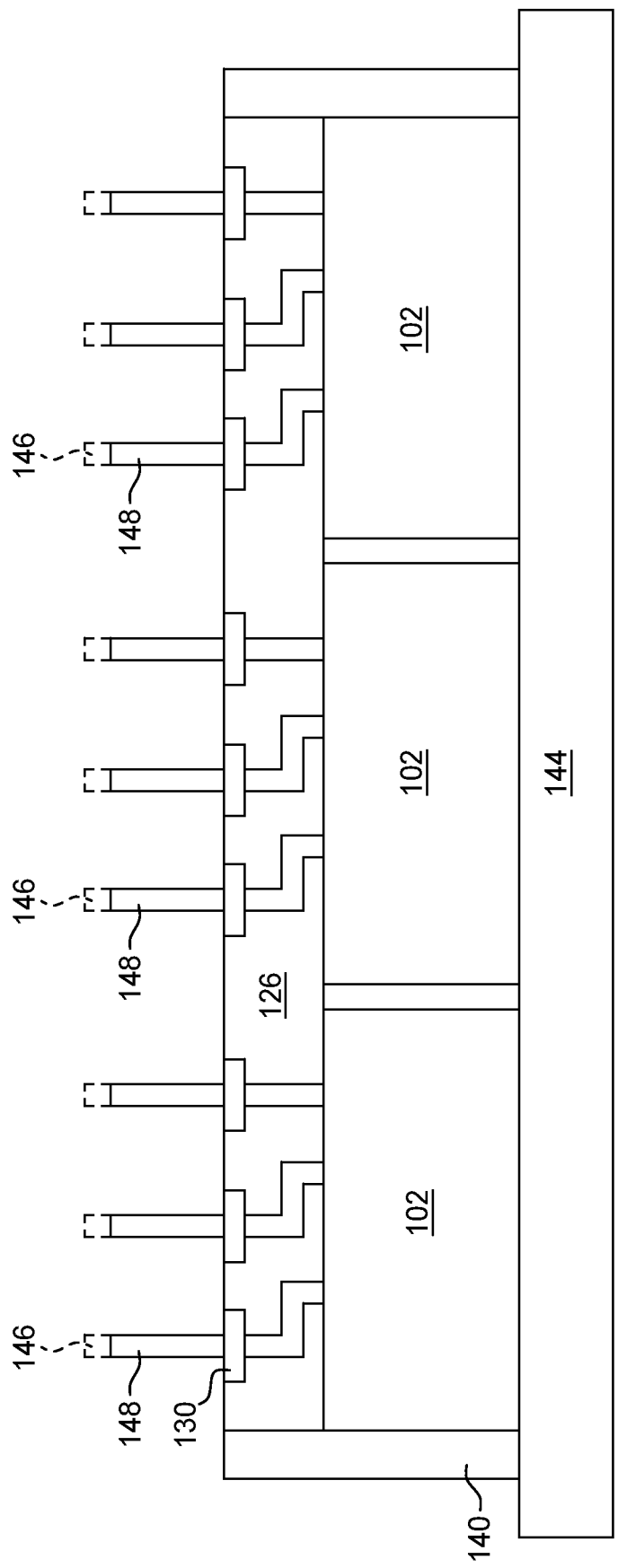
Figure 1F:
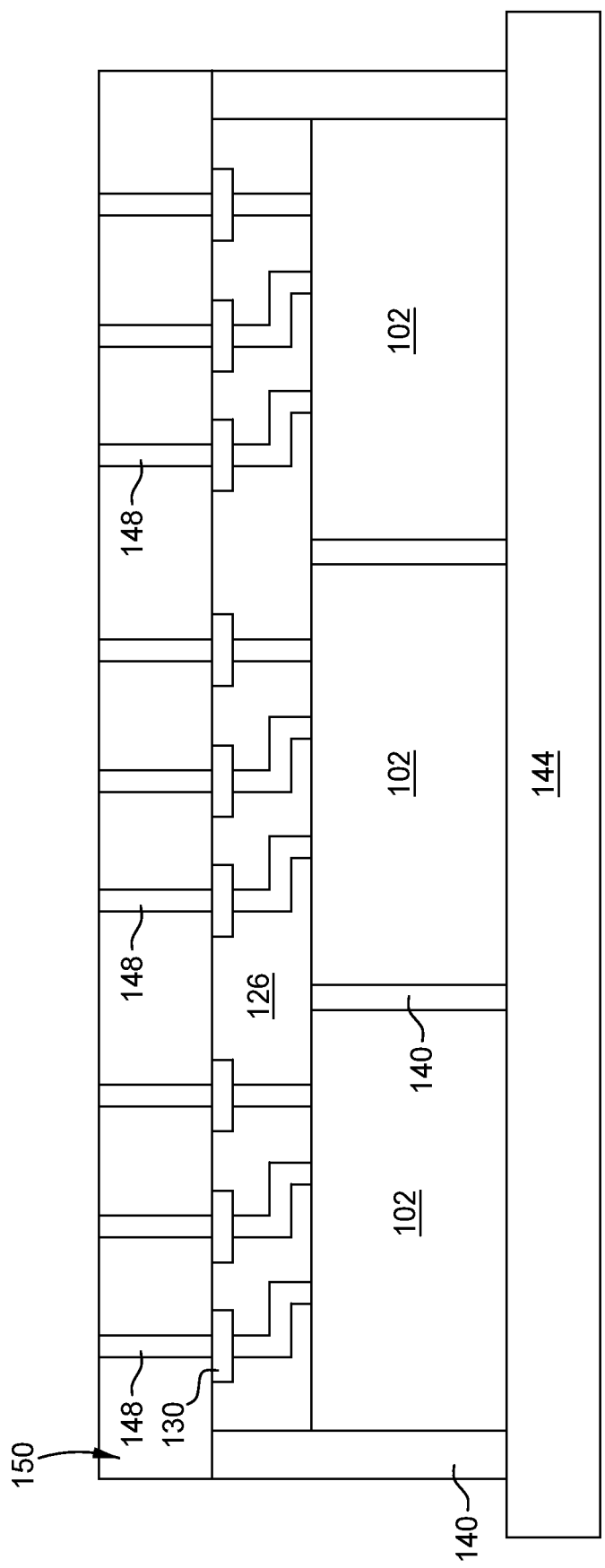
Figure 1G:
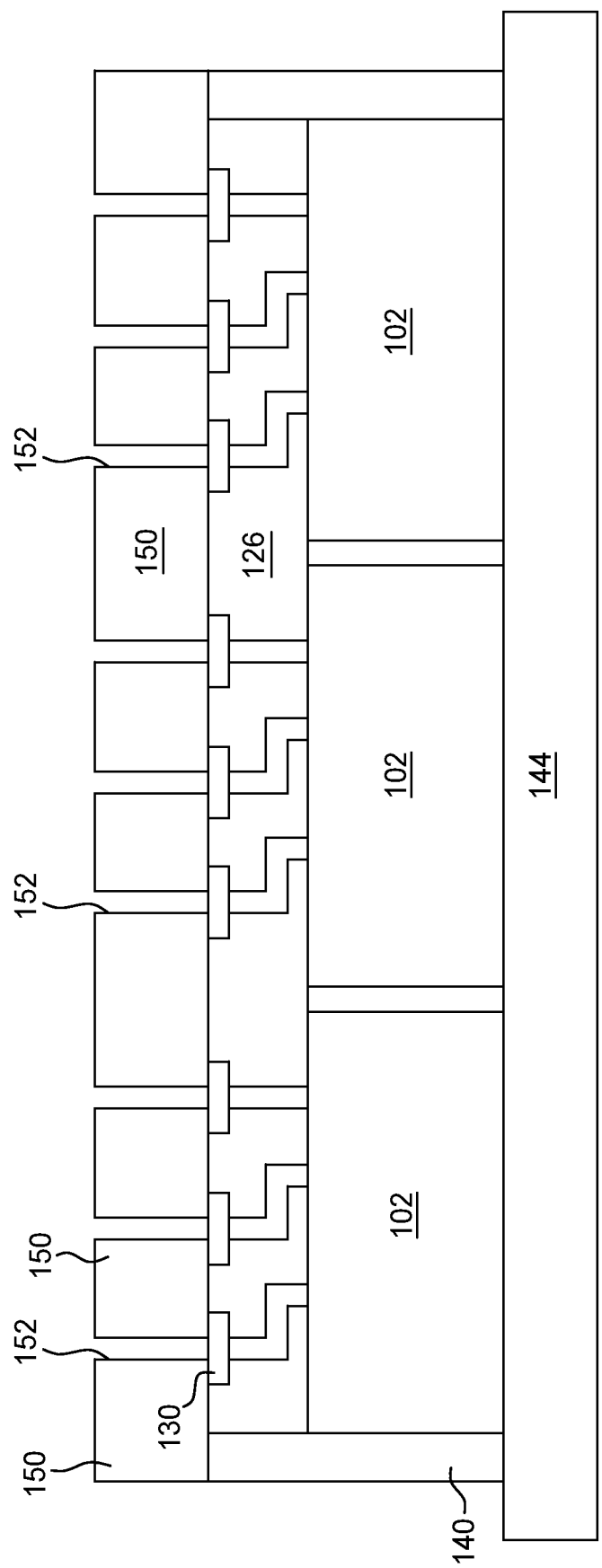
Figure 1H:
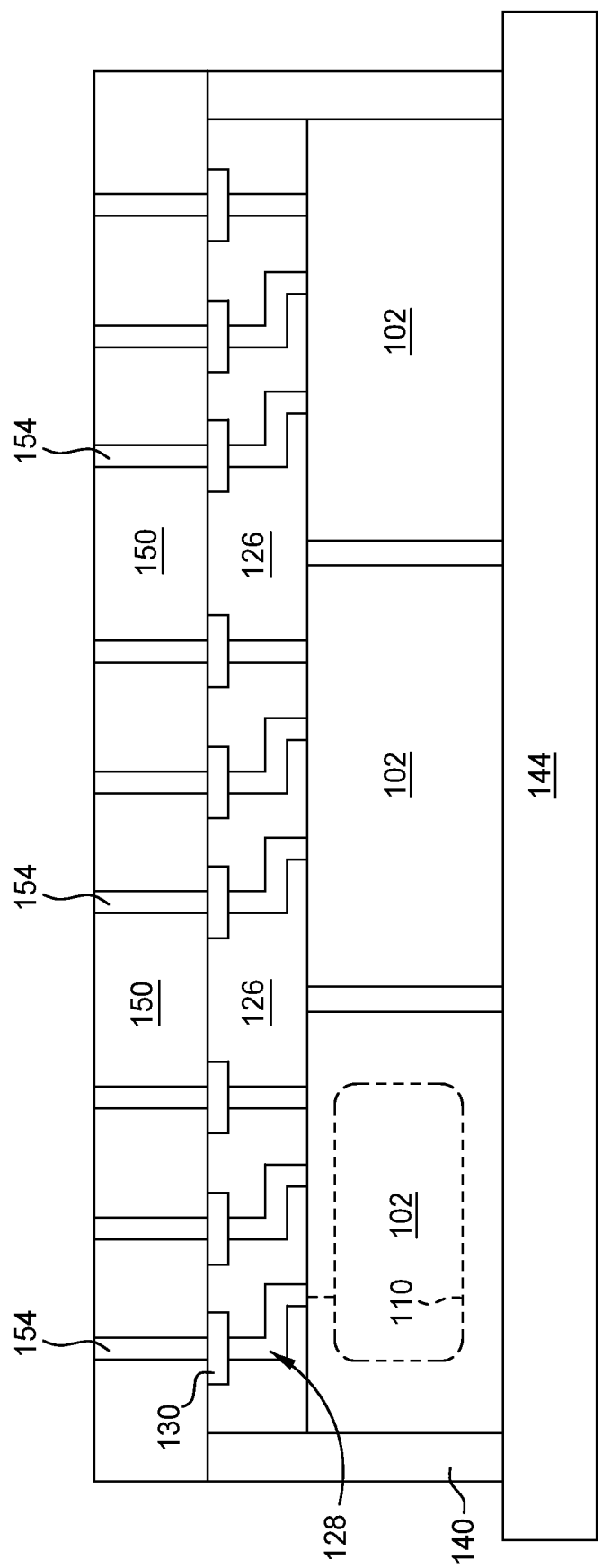
Figure 1I:
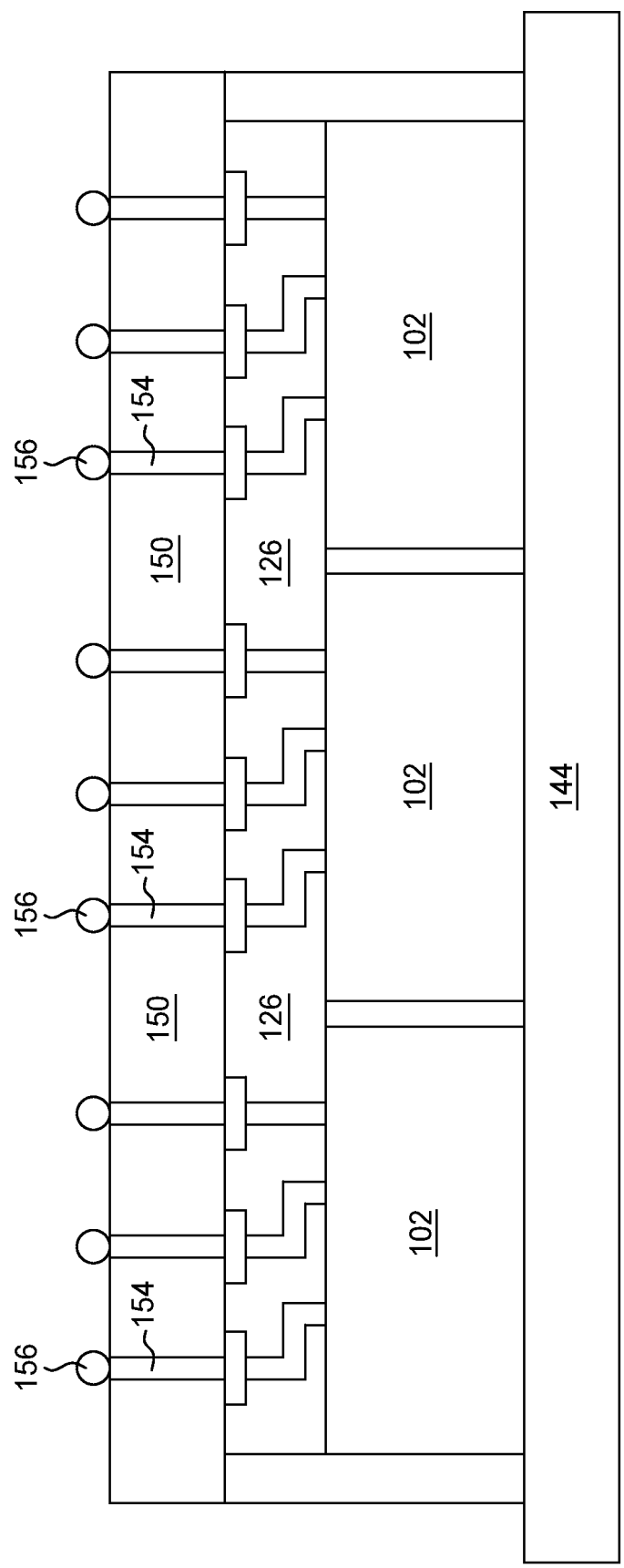
Figure 1J:
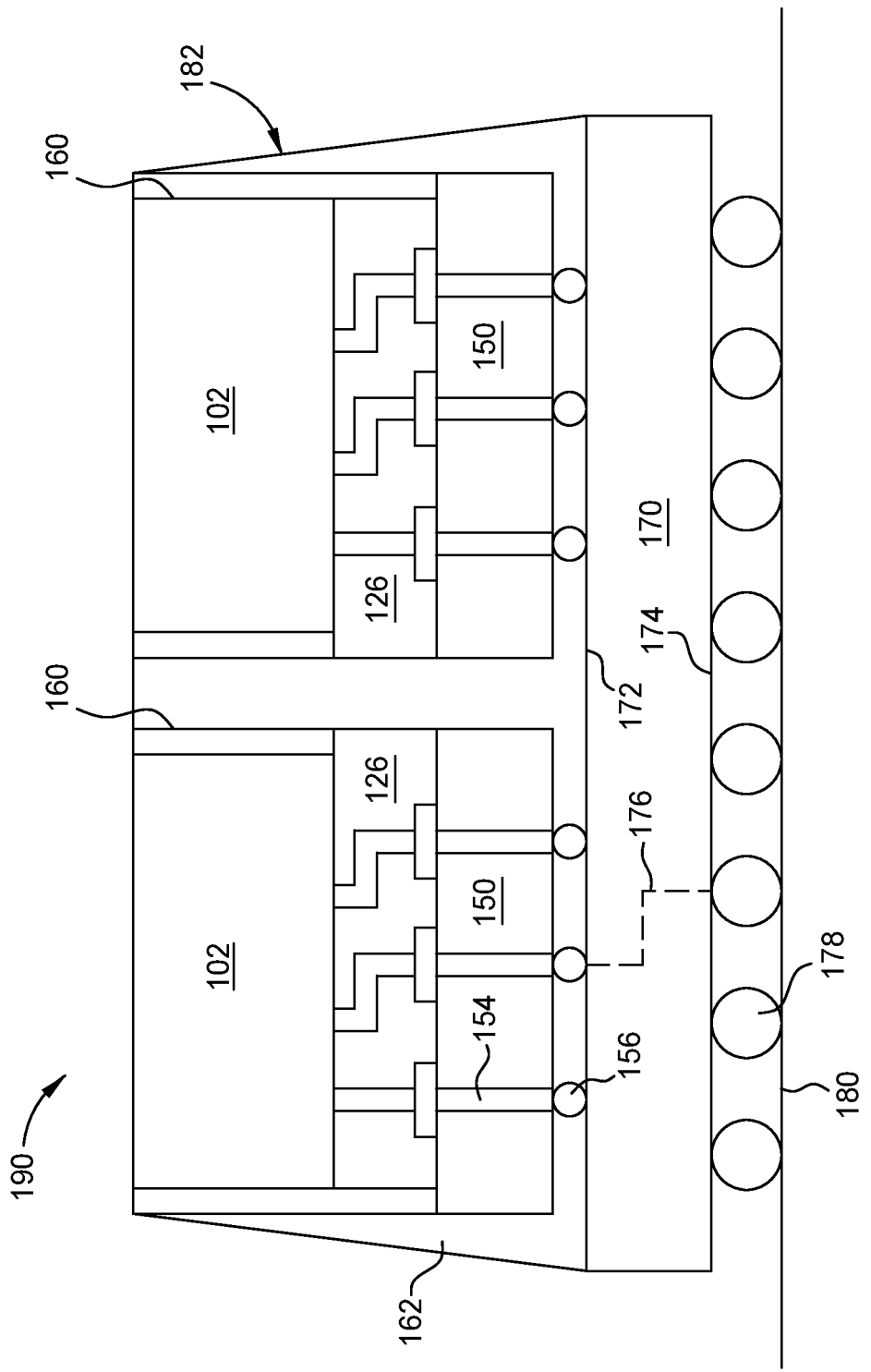
Figure 2:
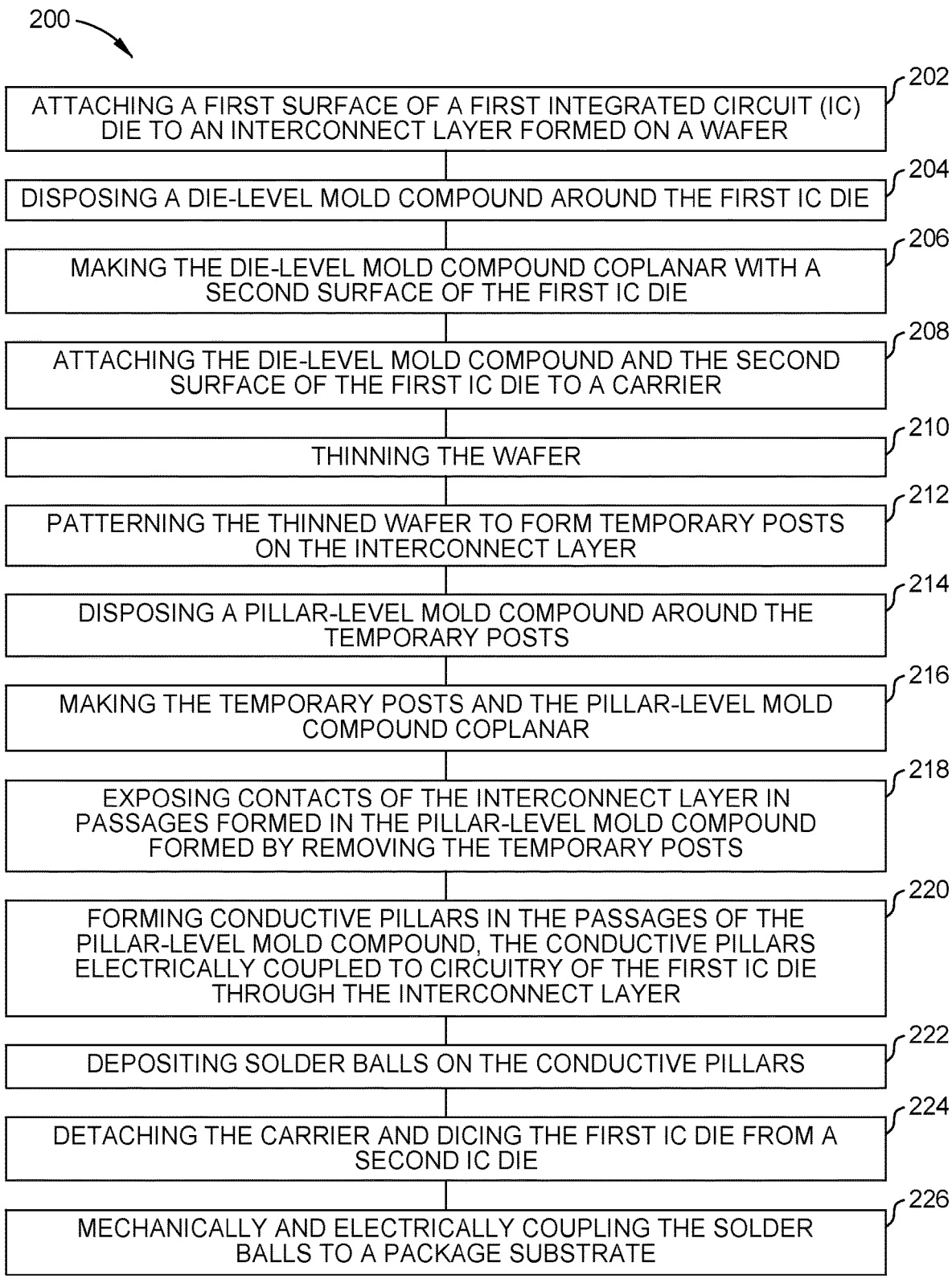
FIG. 2 is a flow diagram of a method for fabricating a chip package assembly having pillars configured to enhance reliability of circuitry within an interconnection layer disposed between an integrated circuit (IC) die and a substrate to which the IC die is mounted.

Turning now to the flow diagram of FIG. 2, a method 200 for fabricating a chip package assembly 182 is disclosed. The method 200 leverages the use of conductive pillars configured to enhance reliability of routing found within an interconnection layer disposed between an integrated circuit (IC) die and a substrate to which the IC die is mounted. Different stages of the method 200 are depicted in the schematic sectional views of FIGS. 1A-1J.

The method 200 for forming a chip package assembly begins at operation 202 by attaching a first integrated circuit (IC) die 102 to an interconnect layer 126 formed on a wafer 120, as illustrated in FIG. 1A. Although in FIG. 1A three (3) IC dies 102 are shown being mounted to the interconnect layer 126, the number of IC dies 102 that can be mounted to the interconnect layer 126 may vary from one (1) IC die 102 to as many IC dies 102 can fit on the interconnect layer 126. A plurality of IC dies 102 may be mounted to a single wafer 120 during initial fabrication stages, and later diced to separate the individual IC dies 102 for final assembly into the chip package assembly.

The IC die 102 generally includes a die body 114. The die body 114 includes sides 108, a first surface (i.e., top surface) 104, and a second surface (i.e., bottom surface) 106. Functional circuitry 110 (shown in phantom) is disposed within the die body 114 and is coupled to contact pads 130 exposed on at least the second surface 106 of the die body 114.

The functional circuitry 110 configures the IC die 102 to perform one or more functions. As such, the functional circuitry 110 may configure or be programed to configure the IC die 102 to be, not limited to, a programmable logic device, such as a field programmable gate array (FPGA), a memory device, such as high band-width memory (HBM) device, an optical device, a processor or other IC logic structure. The IC die 102 may optionally include optical devices such as photo-detectors, lasers, optical sources, and the like.

The interconnect layer 126 includes a first side 194 and a second side 196. The first side 194 of the interconnect layer 126 receives and is contacted by the IC die 102. The second side 196 of the interconnect layer 126 is disposed on the wafer 120. The wafer 120 may be a silicon wafer or other temporary substrate.

The interconnect layer 126 includes one or more metalization layers separated by one or more dielectric layers. The individual dielectric layers separating the individual metalization layers are not shown. For example, the interconnect layer 126 may include 4 dielectric layers and 4 metalization layers, and have a total thickness of about 7 µm. The dielectric layers and metalization layers of the interconnect layer 126 may be formed on the wafer 120 using back end of the line (BEOL) processes.

The metalization layers are patterned to form routings 128. The routings 128 include one or more vias 134 and/or one or more lines 132. One end of the routings 128 terminate on the first side 194 of the interconnect layer 126 to facilitate electrical and mechanical coupling with the contact pads 112 of the IC dies 102. Another end of the routings 128 terminate at contact pads 130 exposed on the second side 196 of the interconnect layer 126. The contact pads 130 are configured to later connect with circuitry of a substrate, as later described below. The second side 196 of the interconnect layer 126 is formed on a first side 122 of the wafer 120. The wafer 120 additionally has a second side 124 facing away from the first side 122.

At operation 204, a die-level mold compound 140 is disposed around the IC dies 102, as illustrated in FIG. 1B. A top surface 142 of the die-level mold compound 140 is disposed above the first surface 104 of the IC die 102 after initial deposition of the die-level mold compound 140. The die-level mold compound 140 also fills the gaps laterally separating the IC dies 102. The die-level mold compound 140 may also be disposed in contact with the sides of the interconnect layer 126, and be in contact with the first surface 122 of the wafer 120. In one example, the die-level mold compound 140 is a polymeric epoxy material.

At operation 206, a portion of the top surface 142 of the die-level mold compound 140 is removed to make the top surface 142 coplanar with the first surface of the IC dies 102, as illustrated in FIG. 1C. The top surface 142 of the die-level mold compound 140 may be removed by grinding, milling, etching or other suitable technique.

At operation 208, a carrier 144 is attached to the top surface 142 of the die-level mold compound 140 and the exposed first surface of the IC dies 102, as illustrated in FIG. 1D. The carrier 144 may be attached using pressure sensitive or other temporary adhesive that facilitates later removal of the carrier 144.

Additionally at operation 208, a resist layer 146 is disposed and patterned on the second side 124 of the wafer 120, as also illustrated in FIG. 1D. The patterned resist layer 146 is generally vertically aligned with the contact pads 130 of the interconnect layer 126. In one example, the resist layer 146 is a spun-on photoresist that is patterned using lithographic techniques.

At operation 210, the wafer 120 is optionally thinned. The wafer 120 may be thinned by grinding, milling, etching, or other suitable technique.

At operation 212, the wafer 120 is patterned to form temporary posts 148 on the interconnect layer 126, as illustrated in FIG. 1E. The wafer 120 may be pattered by etching or other suitable technique using the patterned resist layer 146 as a patterning mask. After the wafer 120 has been patterned to form the posts 148, the resist layer 146 is removed, for example by ashing. In one example, the wafer 120 is formed from silicon and the wafer 120 is patterned by exposure to a silicon etchant, leaving silicon posts 148 extending perpendicularly from the contact pads 130 of the interconnect layer 126.

At operation 214, a pillar-level mold compound 150 is disposed around the temporary posts 148, as illustrated in FIG. 1F. The pillar-level mold compound 150 may be formed from a material selected from the group consisting of epoxy, epoxy with silica filler, and styrene acrylonitrile resin. The pillar-level mold compound 150 may be formed from another suitable dielectric material having electrical and mechanical properties suitable for use in the chip package assembly. The pillar-level mold compound 150 may be deposited by molding, potting or other suitable technique.

At operation 216, the temporary posts 148 and the pillar-level mold compound 150 are made coplanar, as also illustrated in FIG. 1F. The temporary posts 148 and the pillar-level mold compound 150 may be made coplanar by grinding, milling, etching or other suitable technique.

At operation 218, the temporary posts 148 are removed to form passages 152 in the pillar-level mold compound 150, as illustrated in FIG. 1G. The passages 152 may be formed by etching away the temporary posts 148, for example, by exposing the temporary posts 148 to silicon etchants. The temporary posts 148 may alternatively be removed by other suitable techniques. Once the temporary posts 148 are removed, the contact pads 130 of the interconnect layer 126 are exposed at the bottom of the passages 152 formed in the pillar-level mold compound 150.

At operation 220, conductive pillars 154 are formed in the passages 152 of the pillar-level mold compound 150, as illustrated in FIG. 1H. The conductive pillars 154 are formed on and in contact with the contact pads 130 of the interconnect layer 126 exposed at the bottom of the passages 152. The conductive pillars 154 are electrically coupled to circuitry 110 of the IC die 102 through the interconnect layer 126. The conductive pillars 154 may be formed from a metal suitable for signal transmission, such as copper, titanium, tungsten, gold, and silver, among others. In one example, the conductive pillars 154 are plated on the contact pads 130 exposed through the passages 152. The conductive pillars 154 may be deposited on the contact pad 130 electroplating, electroless plating, electrolytic plating, chemical vapor deposition, physical vapor deposition, or other suitable technique. In another example, the seed layer may be first deposited on the contact pad 130, and the conductive pillars 154 deposited on the seed layer to fill the passage 152 using electrolytic plating. In the example illustrated in FIG. 1H, the conductive pillars 154 are fabricated from copper plated on the contact pad 130 to fill the passage 152 to a level essentially coplanar with the exposed surface of the pillar-level mold compound 150.

Although the height that the conductive pillars 154 extend away from the interconnect layer 126 is generally set by the depth of the passage 152 and any post pillar-level mold compound deposition grinding, the height of the conductive pillars 154 is generally much great than a thickness of the interconnect layer 126. For example, the interconnect layer 126 may have a thickness of about 7 µm, while the height of the conductive pillars 154 may be at least about 35 µm. In another example, the height of the conductive pillars 154 is between about 35 µm and 100 µm, such as between about 50 µm and 60 µm. The conductive pillars 154 may also have a diameter between about 10 µm and 20 µm, and a pitch of about 130 µm. The long height and high aspect ratio (height to diameter) of the conductive pillars 154 allows the conductive pillars 154 to move slightly without damage, thus adding stress decoupling compliance to otherwise rigid electrical solder connection between the interconnect layer 126 and the later attached package substrate 170. This compliance make the interconnect layer 126 less susceptible to cracking defects, as discussed above. The material utilized for the pillar-level mold compound 150 may also be selected to enhance the compliance of the solder connection.

At operation 222, solder balls 156 are disposed on the conductive pillars 154, as illustrated in FIG. 1J. At operation 224, the carrier 144 is detached from the IC dies 102, as illustrated in FIG. 1I. Before or after the carrier 144 is detached from the IC dies 102, the IC dies 102 may be separated (e.g., diced) into separate die/interconnect/pillar (DIP) assemblies, illustrated by reference numeral 160 in FIG. 1J.

At operation 226, one or more DIP assemblies 160 are mounted to a package substrate 170 to form a chip package assembly 182, as illustrated in FIG. 1J. A package level mold compound 162 may be disposed over the one or more DIP assemblies 160 and the package substrate 170 to provide rigidity and to protect the solder balls 156 connecting the DIP assembly to the package substrate 170. When mounting the DIP assembly 160 to the package substrate 170, the solder balls 156 are reflowed to mechanically and electrically couple the pillars 154 to a top surface 172 of the package substrate 170. Once the IC die 102 is mounted to the package substrate 170, the circuitry 110 of the IC die 102 is electrically coupled to circuitry 176 of the package substrate 170 through the solder balls 156, pillars 154, and the contact pads 130 and routing 128 of the interconnect layer 126. A bottom surface 174 of the package substrate 170 may also be mounted via solder balls 178 to a printed circuit board (PCB) 180 to form an electronic device 190.

The pillars 154 and pillar-level mold compound 150 provide a quasi-compliant structure for connecting the interconnect layer 126 to the package substrate 170 as compared to rigidly soldering the interconnect layer 126 directly to the package substrate 170. The pillars 154 and pillar-level mold compound 150 allow sufficient compliance, i.e., movement, between the IC dies 102 and interconnect layer 126 relative to the package substrate 170 to decouple stresses that are conventionally generated during assembly and use by differences in the thermal expansion between the IC dies 102, the interconnect layer 126 and the package substrate 170. The decoupling of the stress results in a more robust and reliable solder connection, which consequently results in improved performance, reliability and service life of the chip package assembly 182.

FIGS. 3A-3L are schematic sectional views across different stages of another chip package assembly fabrication sequence, one example of which described with reference to a method 400 described with reference to FIG. 4. Many of the elements/components of a chip package assembly 382 generated using the fabrication method 400 of FIG. 4 are identical to the chip package assembly 182 described above, and as such, identical reference numerals have been utilized.

Figure 3A:
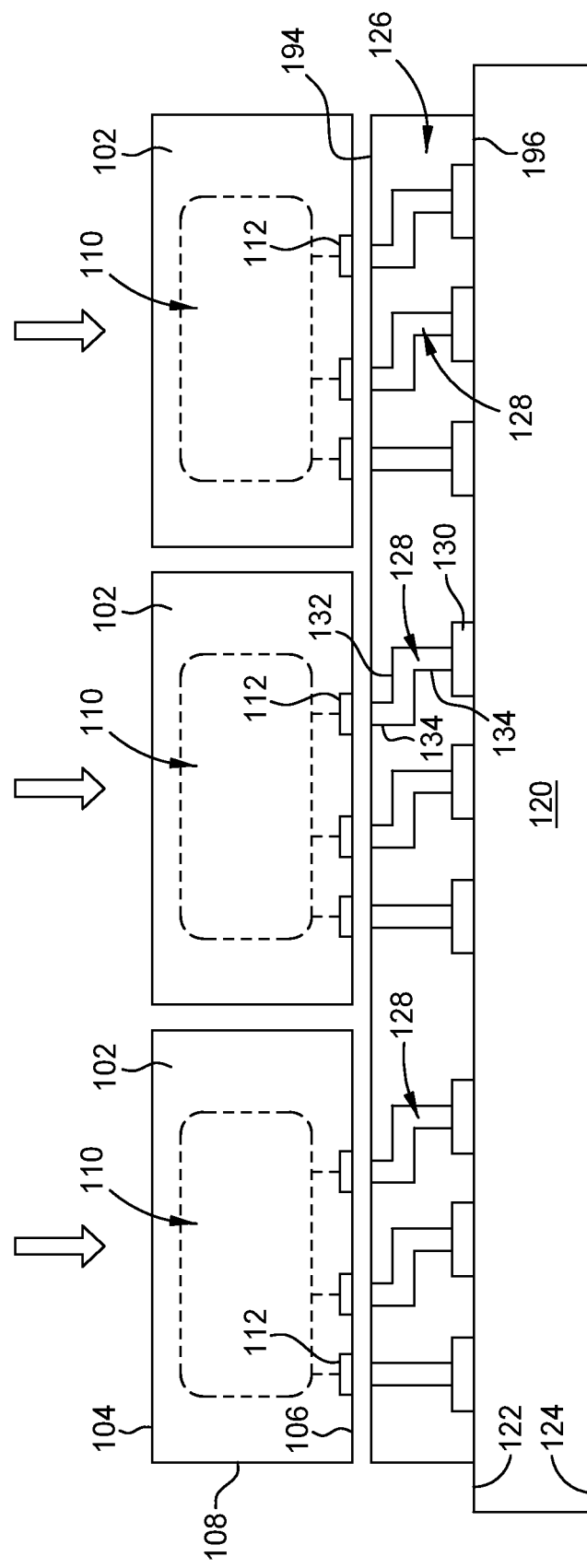
FIGS. 3A-3L are schematic sectional views across different stages of another chip package assembly fabrication sequence, one example of which described with reference to a method described with reference to FIG. 4.
Figure 4:
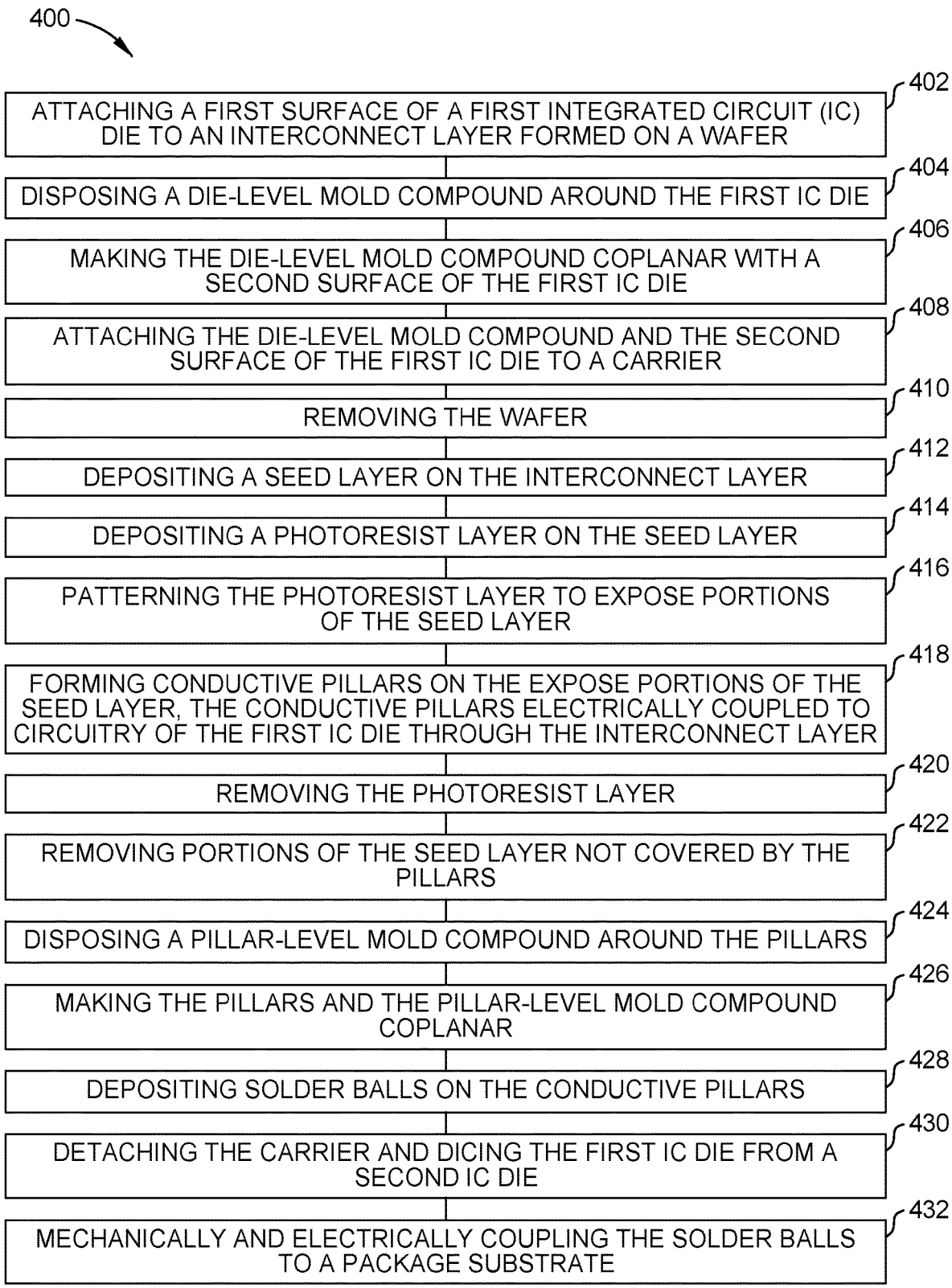
FIG. 4 is a flow diagram of another method for fabricating a chip package assembly having pillars configured to enhance reliability of circuitry within an interconnection layer disposed between an IC die and a substrate to which the IC die is mounted.

The method 400 for forming a chip package assembly 382 begins at operation 402 by attaching a first integrated circuit (IC) die 102 to an interconnect layer 126 formed on a wafer 120, as illustrated in FIG. 3A. Although in FIG. 3A three (3) IC dies 102 are shown being mounted to the interconnect layer 126, the number of IC dies 102 that can be mounted to the interconnect layer 126 may vary from one (1) IC die 102 to as many IC dies 102 can fit on the interconnect layer 126. A plurality of IC dies 102 may be mounted to a single wafer 120 during initial fabrication stages, and later diced to separate the individual IC dies 102 for final assembly into the chip package assembly 382.

The IC die 102 generally includes a die body 114. The die body 114 includes sides 108, a first surface (i.e., top surface) 104, and a second surface (i.e., bottom surface) 106. Functional circuitry 110 (shown in phantom) is disposed within the die body 114 and is coupled to contact pads 130 exposed on at least the second surface 106 of the die body 114. The IC die 102 may be configured as described above with reference to FIG. 1A.

The interconnect layer 126 includes a first side 194 and a second side 196. The first side 194 of the interconnect layer 126 receives and is contacted by the IC die 102. The second side 196 of the interconnect layer 126 is disposed on the wafer 120. The wafer 120 may be a silicon wafer or other temporary substrate.

The interconnect layer 126 is fabricated as described above with reference to FIG. 1A, having metalization layers patterned to form routings 128. One end of the routings 128 terminate on the first side 194 of the interconnect layer 126 to facilitate electrical and mechanical coupling with the contact pads 112 of the IC dies 102. Another end of the routings 128 terminate at contact pads 130 exposed on the second side 196 of the interconnect layer 126. The second side 196 of the interconnect layer 126 is formed on a first side 122 of the wafer 120.

Figure 3B:
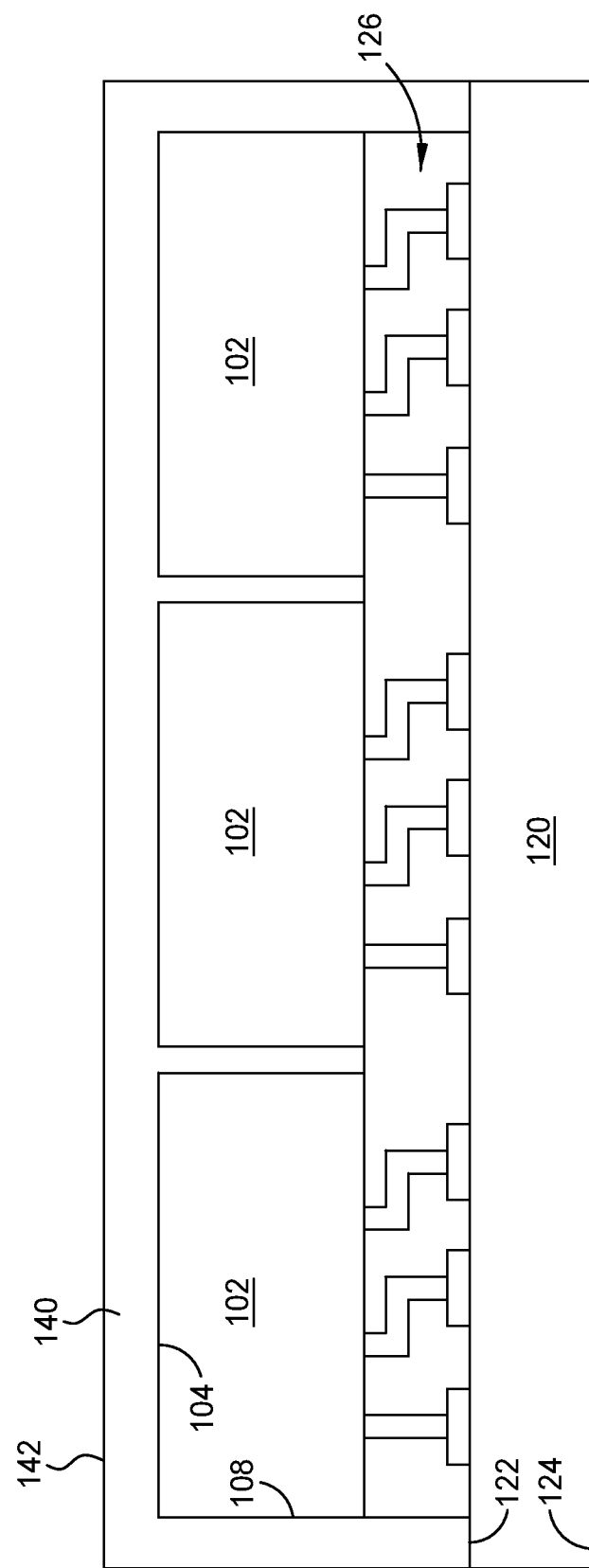

At operation 404, a die-level mold compound 140 is disposed around the IC dies 102, as illustrated in FIG. 3B. A top surface 142 of the die-level mold compound 140 is disposed above the first surface 104 of the IC die 102 after initial deposition of the die-level mold compound 140. The die-level mold compound 140 also fills the gaps laterally separating the IC dies 102. The die-level mold compound 140 may also be disposed in contact with the sides of the interconnect layer 126, and be in contact with the first surface 122 of the wafer 120.

Figure 3C:
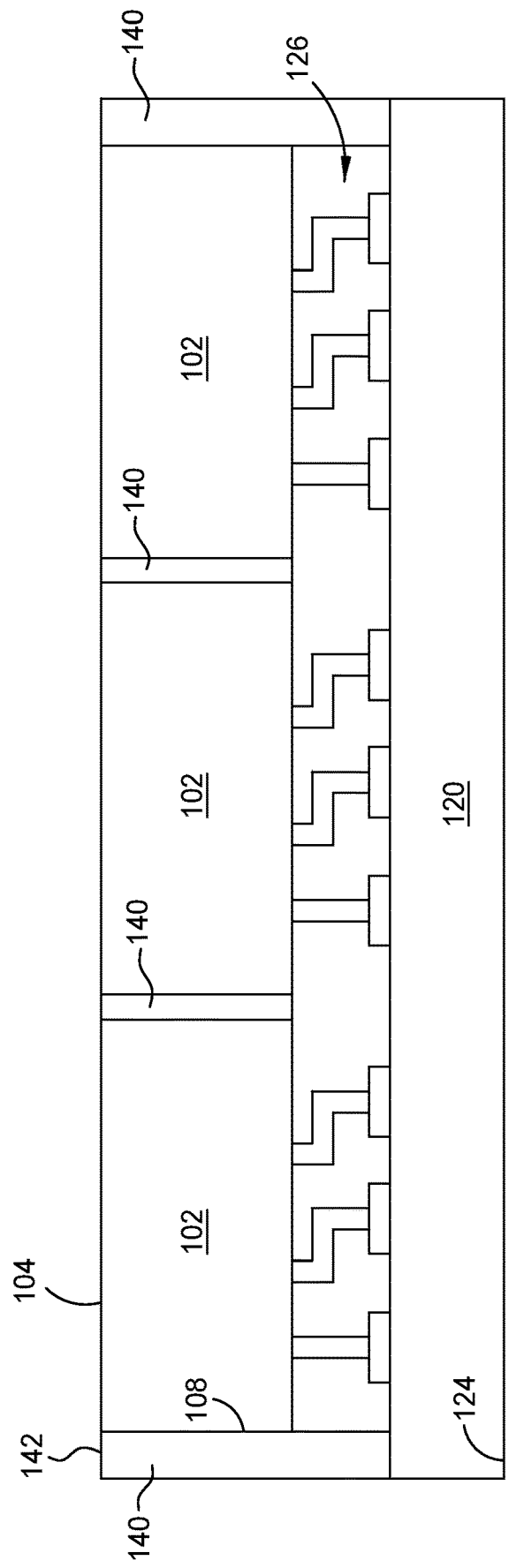

At operation 406, a portion of the top surface 142 of the die-level mold compound 140 is removed to make the top surface 142 coplanar with the first surface of the IC dies 102, as illustrated in FIG. 3C. The top surface 142 of the die-level mold compound 140 may be removed by grinding, milling, etching or other suitable technique.

Figure 3D:
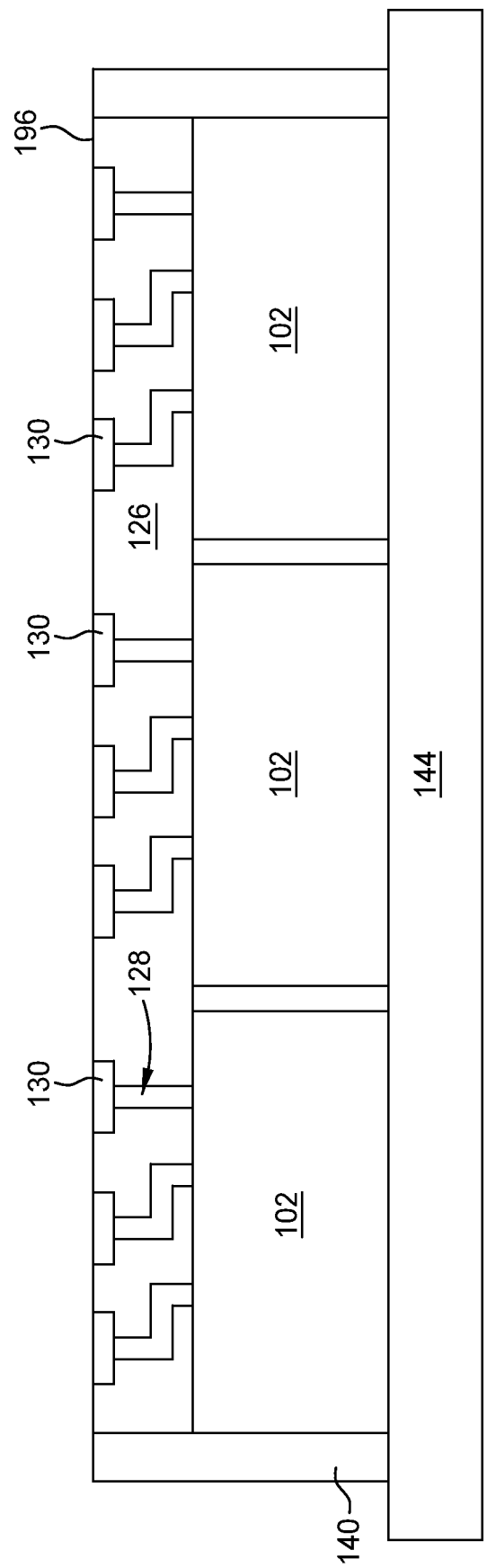

At operation 408, a carrier 144 is attached to the top surface 142 of the die-level mold compound 140 and the exposed first surface of the IC dies 102, as illustrated in FIG. 3D. The carrier 144 may be attached using pressure sensitive or other temporary adhesive that facilitates later removal of the carrier 144.

At operation 410, the wafer 120 is removed, as also illustrated in FIG. 3D. The wafer 120 may be removed by debonding, grinding, milling, etching, or other suitable technique. Once the wafer 120 is removed, the second side 196 of the interconnect layer 126 is exposed.

Figure 3E:
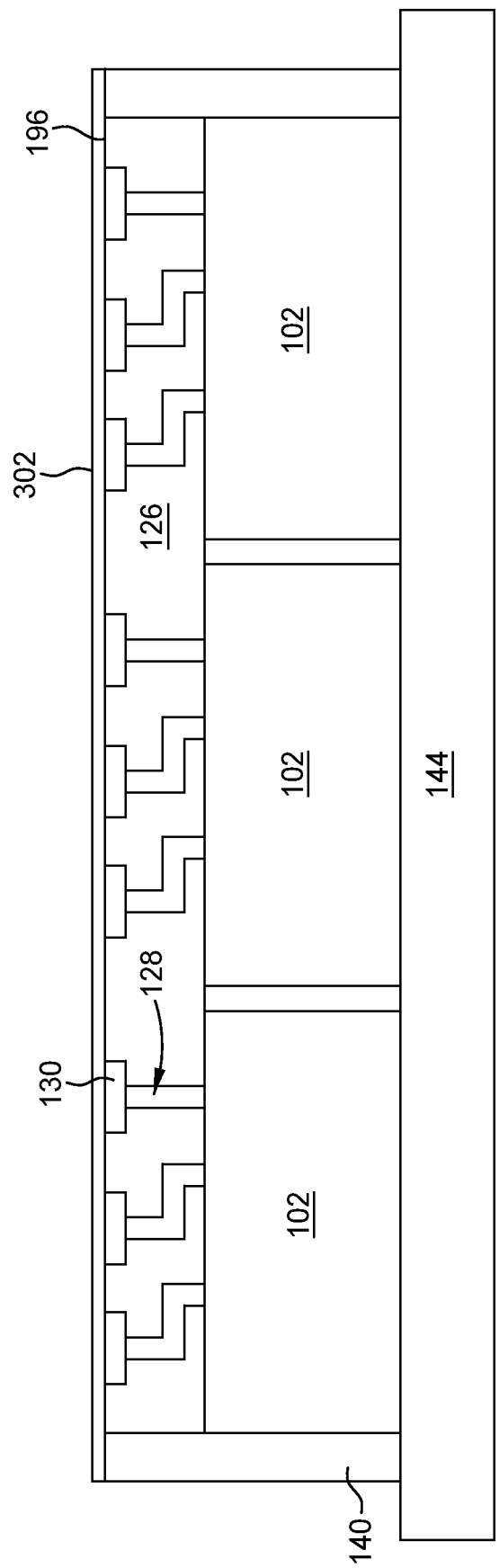

At operation 412, a seed layer 302 is deposited on the second side 196 of the interconnect layer 126, as illustrated in FIG. 3E. As the contact pads 130 are also exposed on the second side 196 of the interconnect layer 126, the seed layer 302 is deposited is also deposited on the contact pads 130. The seed layer 302 is formed from a material suitable to provide an initiation surface for electrolytic plating. The seed layer 302 may be formed by a physical vapor deposition or other suitable process. In one example, the seed layer 302 is a metal such as copper, palladium, or other suitable material.

Figure 3F:
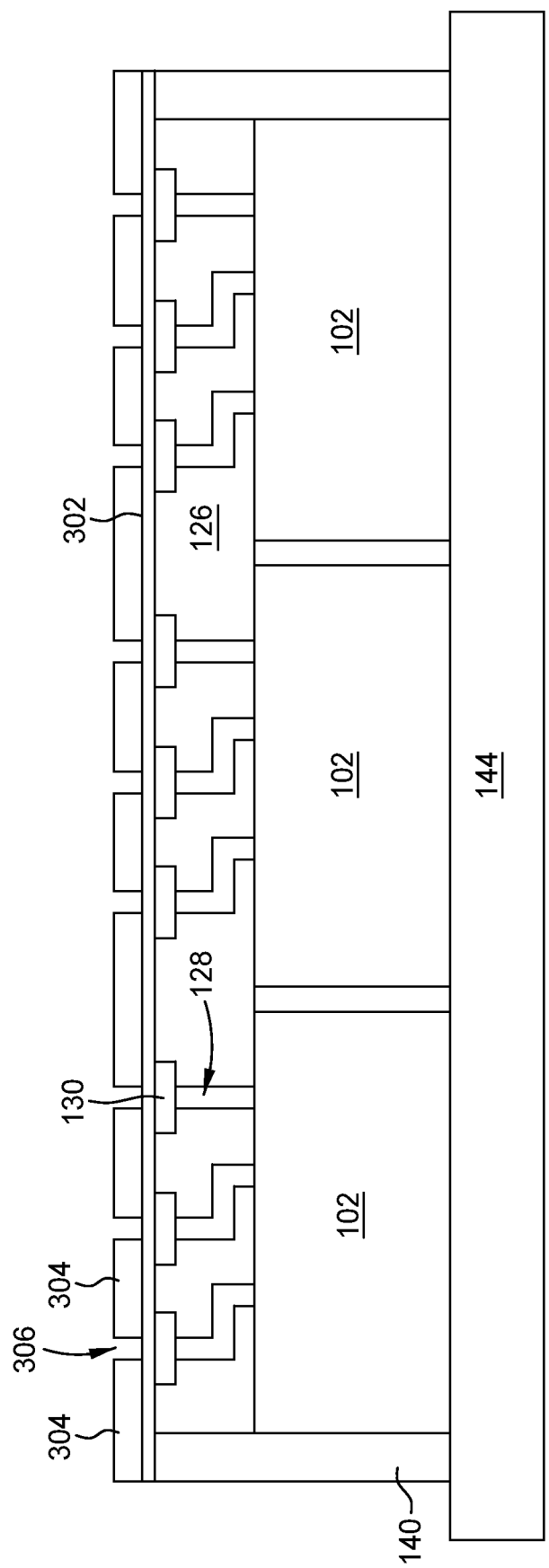

At operation 414, a resist layer 304 is deposited on the seed layer 302. At operation 416, the resist layer 304 is patterned to form openings 306 that expose portions of the underlying seed layer 302, as illustrated in FIG. 3F. The openings 306 are generally located directly above each contact pad 130. In one example, the resist layer 304 is a spun-on photoresist that is patterned using lithographic techniques.

Figure 3G:
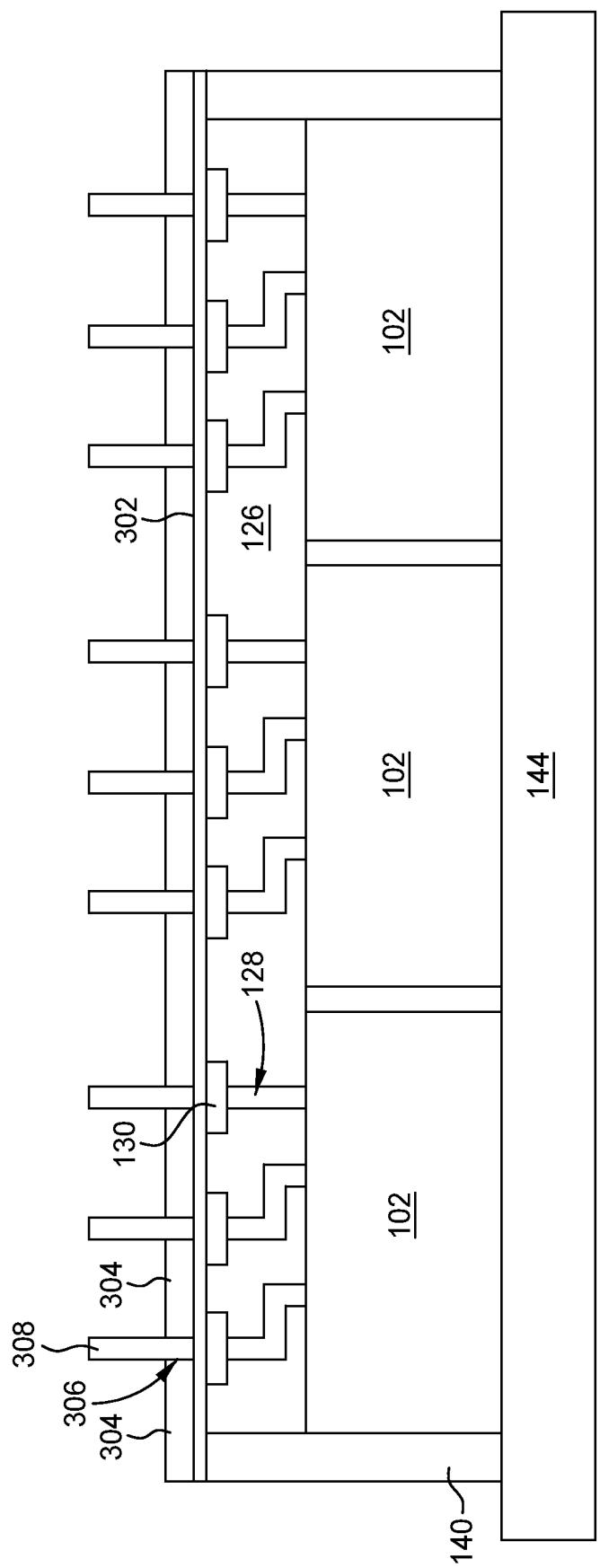

At operation 418, conductive posts 308 are formed on the portions of the seed layer 302 exposed through the openings 306 in the resist layer 304, as illustrated in FIG. 3G. The conductive posts 308 may be formed from a metal suitable for signal transmission, such as copper, titanium, tungsten, gold, and silver, among others. In one example, the conductive pillars 154 are fabricated from plated copper, such as electroless plated copper.

Figure 3H:
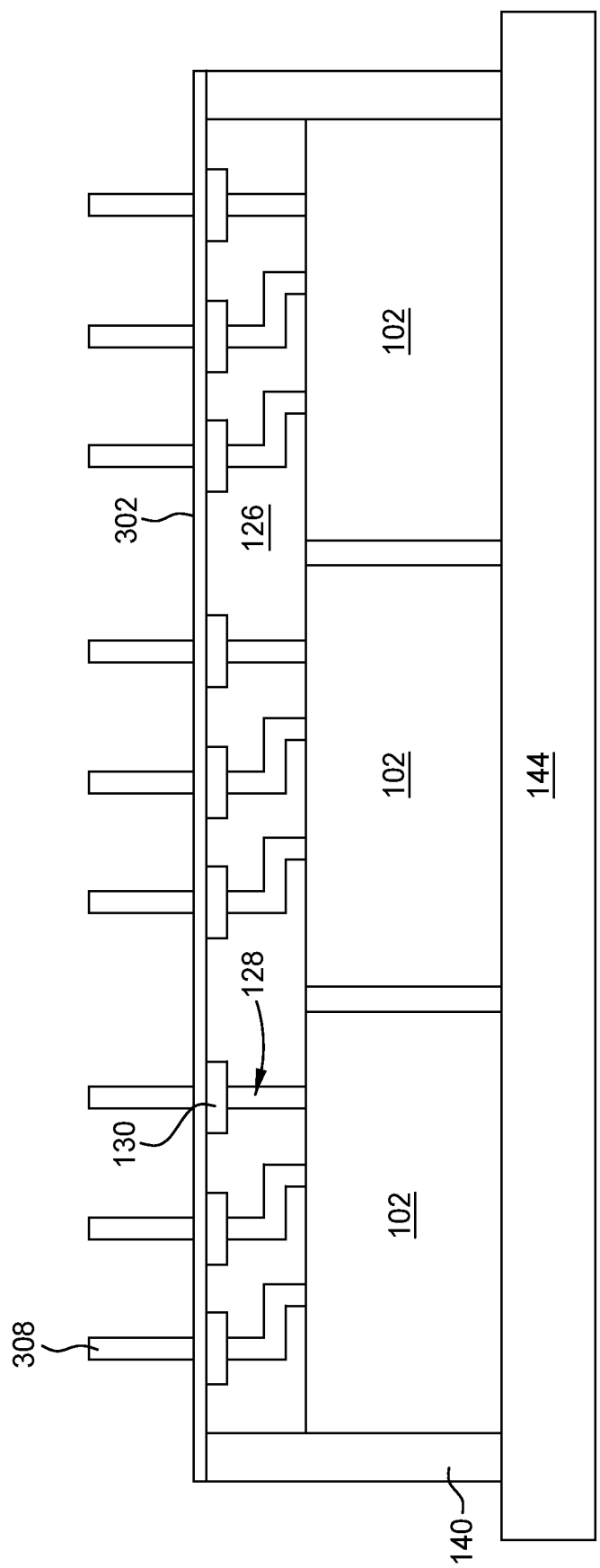

At operation 420, the resist layer 304 is removed to reveal portions of the seed layer 302 exposed between the conductive posts 308, as illustrated in FIG. 3H. The resist layer 304 may be removed by ashing or other suitable technique.

Figure 3I:
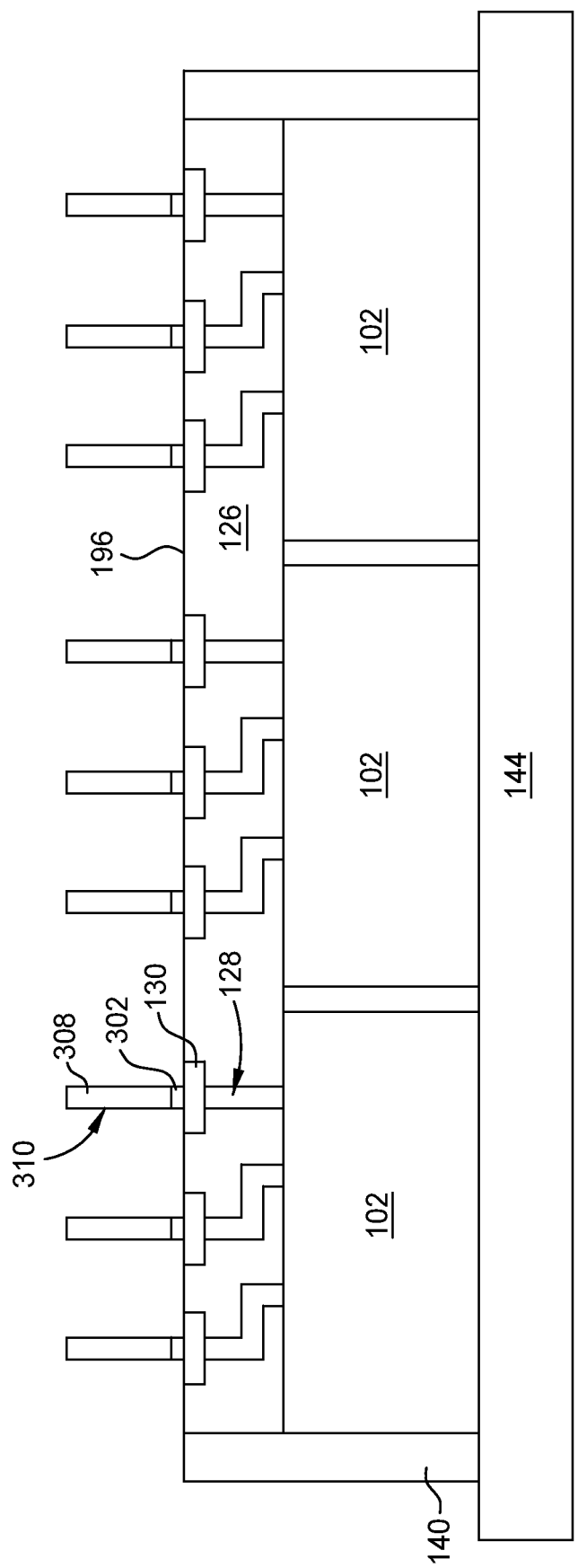

At operation 422, the portions of the seed layer 302 exposed between the conductive posts 308 are removed, as illustrated in FIG. 3I. The portions of the seed layer 302 exposed between the conductive posts 308 may be removed by etching or other suitable technique. Once the portions of the seed layer 302 exposed between the conductive posts 308 are removed, each pair of remaining seed layer 302 and overlying conductive post 308 form a conductive pillar 310. Each conductive pillar 310 is directly disposed on a respective one of the contact pads 130 of the interconnect layer 126, such that the conductive pillars 310 are electrically coupled to circuitry of the IC dies 102 through the interconnect layer 126, thus proving a robust electrical signal transmission path between the IC die 102 and the later mounted package substrate. The conductive pillars 310 generally have the same geometry as described above with reference to the conductive pillars 154, thus allowing the conductive pillars 310 to have the same stress decoupling attributes as the conductive pillars 154.

Figure 3J:
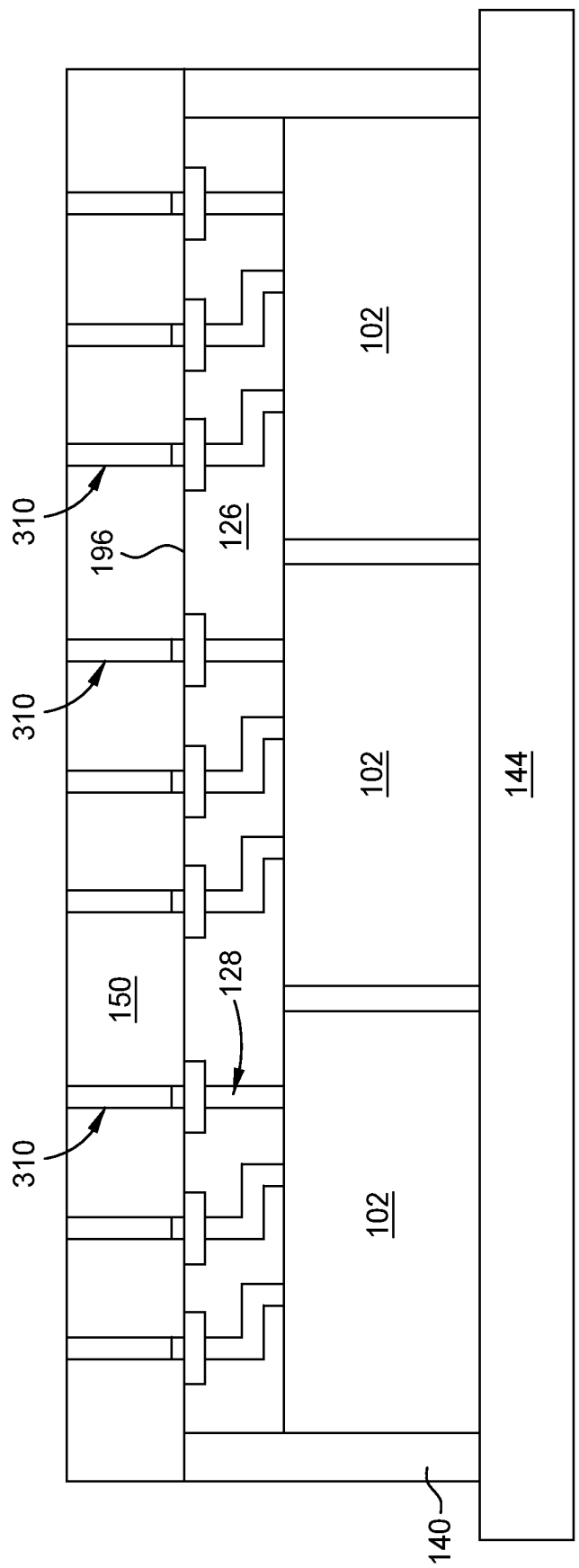

At operation 424, a pillar-level mold compound 150 is disposed around the pillars 310, as illustrated in FIG. 3J. The pillar-level mold compound 150 may be formed from a material selected from the group consisting of epoxy, epoxy with silica filler, and styrene acrylonitrile resin. The pillar-level mold compound 150 may be formed from another suitable dielectric material having electrical and mechanical properties suitable for use in the chip package assembly. The pillar-level mold compound 150 may be deposited by molding or other suitable technique.

At operation 426, the pillars 310 and the pillar-level mold compound 150 are made coplanar, as also illustrated in FIG.

3J. The pillars 310 and the pillar-level mold compound 150 may be made coplanar by grinding, milling, etching or other suitable technique.

Figure 3K:
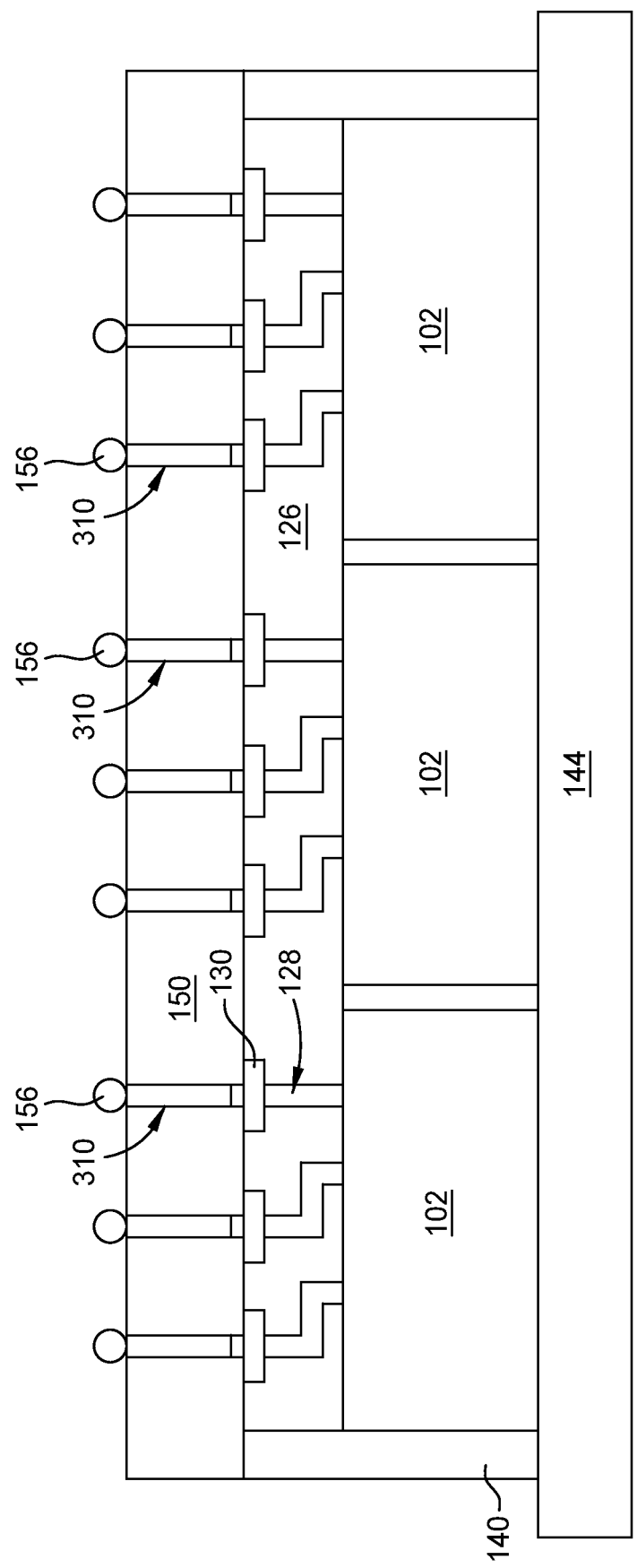

At operation 428, solder balls 156 are disposed on the conductive pillars 310, as illustrated in FIG. 3K. At operation 430, the carrier 144 is detached from the IC dies 102. Before or after the carrier 144 is detached from the IC dies 102, the IC dies 102 may be separated (e.g., diced) into separate die/interconnect/pillar (DIP) assemblies, illustrated by reference numeral 360 in FIG. 3L.

Figure 3L:
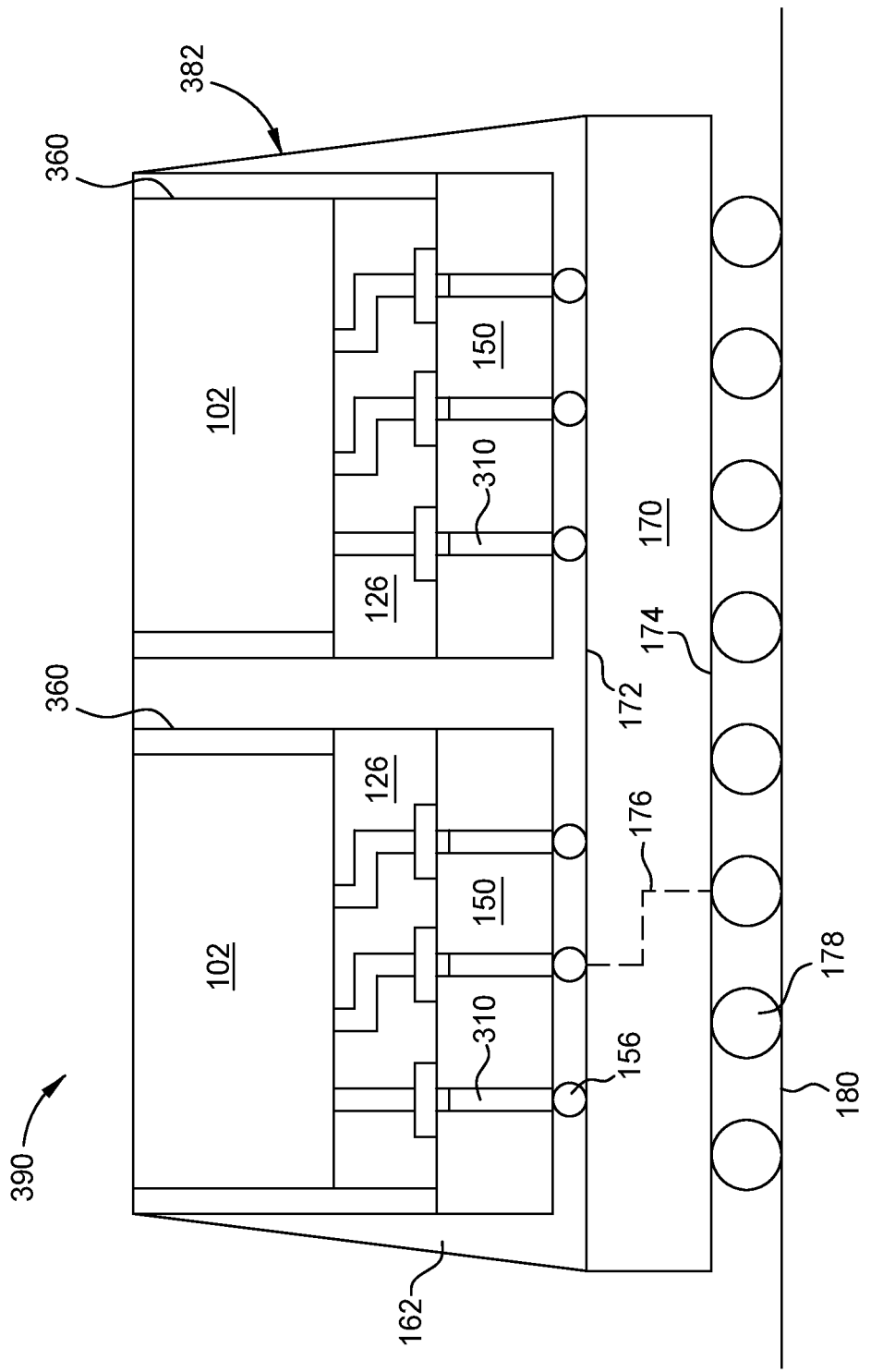

At operation 432, one or more DIP assemblies 360 are mounted to a package substrate 170 to form a chip package assembly 382, as illustrated in FIG. 3L. A package level mold compound 362 may be disposed over the one or more DIP assemblies 360 and the package substrate 170 to provide rigidity and to protect the solder balls 156 connecting the DIP assembly 360 to the package substrate 170. When mounting the DIP assembly 360 to the package substrate 170, the solder balls 156 are reflowed to mechanically and electrically couple the pillars 310 to a top surface 172 of the package substrate 170. Once the IC die 102 is mounted to the package substrate 170, the circuitry 110 of the IC die 102 is electrically coupled to circuitry 176 of the package substrate 170 through the solder balls 156, pillars 310, and the contact pads 130 and routing 128 of the interconnect layer 126. A bottom surface 174 of package substrate 170 may also be mounted via solder balls 178 to a printed circuit board (PCB) 180 to form an electronic device 190.

As discussed above, the pillars 310 and pillar-level mold compound 150 provide a quasi-compliant structure for connecting the interconnect layer 126 to the package substrate 170 as compared to rigidly soldering the interconnect layer 126 directly to the package substrate 170. The pillars 310 and pillar-level mold compound 150 decouple stresses and protect the routings 128 of the interconnect layer 126 from crack propagation, such could lead to diminished performance or even device failure. The decoupling of the stress results in a more robust and reliable solder connection, which consequently results in improved performance, reliability and service life of the chip package assembly 382.

Thus, a chip package assembly and methods for fabricating the same have been provided which utilize conductive pillars disposed between an interconnect layer and a solder ball to protect the interconnect layer from crack associated damage. The conductive pillars and the surrounding pillar-level mold compound are more compliant than the interconnect layer, and thus enhance the resistance to crack initiation and prorogation into the routings of the interconnect layer. Advantageously, a more robust and reliable solder interconnect is enabled by the compliant pillars to provide improved manufacturing yield, reliability, life and performance of the chip package assembly While the foregoing is directed to embodiments of the present invention, other and further embodiments of the invention may be devised without departing from the basic scope thereof, and the scope thereof is determined by the claims that follow.

What is claimed is:

1. A chip package assembly comprising:
    an integrated circuit (IC) die having a die body containing functional circuitry, the die body having a lower surface, an upper surface and sides, the IC die having contact pads coupled to the functional circuitry and exposed on the lower surface of the die body;
    an interconnect layer formed on the lower surface of the die body;
    a plurality of pillars formed on the interconnect layer and electrically coupled to the contact pads through routing formed through the interconnect layer;
    a pillar-level mold compound disposed on the interconnect layer, the plurality of pillars disposed through passages formed through the pillar-level mold compound; wherein the plurality of pillars are coplanar with a surface of the pillar-level mold compound; and
    a die-level mold compound having a top surface coplanar with the upper surface of the IC die, and wherein the die-level mold compound having a bottom surface in contact with a top surface of the interconnect layer, and wherein the bottom surface of the die-level mold compound is coplanar with a bottom surface of the interconnect layer.

2. The chip package assembly of claim 1 further comprising:
    a package substrate having an upper surface coupled to the plurality of pillars via solder connections.

3. The chip package assembly of claim 1, wherein the plurality of pillars further comprises:
    a seed layer disposed between the pillars and the interconnect layer.

4. The chip package assembly of claim 1, wherein the plurality of pillars are electroless plated.

5. The chip package assembly of claim 1, wherein the die-level mold compound surrounds the sides of the die body, the die-level mold separated from the pillar-level mold compound by the interconnect layer.

6. The chip package assembly of claim 1, wherein the pillar-level mold compound is fabricated from a material selected from the group consisting of epoxy, epoxy with silica filler, and styrene acrylonitrile resin.

7. The chip package assembly of claim 1, wherein the plurality of pillars extend from the interconnect layer to a height of at least 35 μm.

8. The chip package assembly of claim 1, wherein the plurality of pillars extend from the interconnect layer between about 35 μm and 100 μm.

9. A method for forming a chip package assembly, the method comprising:
    attaching a first surface of a first integrated circuit (IC) die to an interconnect layer formed on a wafer;
    disposing a die-level mold compound around the first IC die;
    making the die-level mold compound coplanar with a second surface of the first IC die;
    attaching the die-level mold compound and the second surface of the first IC die to a carrier;
    patterning the wafer to form temporary posts on the interconnect layer;
    disposing a pillar-level mold compound around the temporary posts;
    making the temporary posts and the pillar-level mold compound coplanar;
    exposing contacts of the interconnect layer in passages formed in the pillar-level mold compound formed by removing the temporary posts;
    forming conductive pillars in the passages of the pillar-level mold compound, the conductive pillars electrically coupled to circuitry of the first IC die through the interconnect layer;
    depositing solder balls on the conductive pillars; and
    detaching the carrier.

10. The method of claim 9, wherein forming the conductive pillars further comprise:
    plating the conductive pillars.

11. The method of claim 9, wherein forming the conductive pillars further comprise:
forming the conductive pillars to a height of at least 35 µm.

12. The method of claim 9 further comprising:
mechanically and electrically coupling the solder balls to a package substrate, the solder balls electrically coupling circuitry of the package substrate to the circuitry of the first IC die through the conductive pillars and the interconnect layer.

13. The method of claim 9, wherein prior to mechanically and electrically coupling the solder balls to a package substrate, dicing a second IC die from the first IC die.

14. A method for forming a chip package assembly, the method comprising:
attaching a first surface of a first integrated circuit (IC) die to an interconnect layer formed on a wafer;
disposing a die-level mold compound around a first integrated circuit (IC) die;
making the die-level mold compound coplanar with a second surface of the first IC die;
attaching the die-level mold compound and the second surface of the first IC die to a carrier;
removing the wafer;
depositing a seed layer on the interconnect layer;
depositing a photoresist layer on the seed layer;
patterning the photoresist layer to exposed portions of the seed layer;
forming conductive posts on the exposed portions of the seed layer;
removing the photoresist layer;
removing portions of the seed layer not covered by the conductive posts, the remaining portion of the seed layer and conductive posts forming conductive pillars that are electrically coupled to circuitry of the first IC die through the interconnect layer;
disposing a pillar-level mold compound around the conductive pillars;
making the conductive pillars and the pillar-level mold compound coplanar;
depositing solder balls on the conductive pillars; and
detaching the carrier.

15. The method of claim 14, wherein forming the conductive pillars further comprise:
plating the conductive pillars.

16. The method of claim 14, wherein forming the conductive pillars further comprise:
forming the conductive pillars to a height of at least 35 µm.

17. The method of claim 14 further comprising:
mechanically and electrically coupling the solder balls to a package substrate, the solder balls electrically coupling circuitry of the package substrate to the circuitry of the first IC die through the conductive pillars and the interconnect layer.

18. The method of claim 14, wherein disposing the pillar-level mold compound around the conductive pillars further comprises:
depositing a material around the conductive pillars selected from the group consisting of epoxy, epoxy with silica filler, and styrene acrylonitrile resin.

19. The method of claim 14 further comprising:
prior to mechanically and electrically coupling the solder balls to a package substrate, dicing a second IC die from the first IC die.

* * * * *